(12) United States Patent  (10) Patent No.: US 12,237,251 B2
Kim et al.  (45) Date of Patent: Feb. 25, 2025

(54) SEMICONDUCTOR PACKAGE INCLUDING CONNECTION PAD INCLUDING GROOVE PATTERN

(71) Applicant: SK hynix Inc., Icheon-si (KR)

(72) Inventors: Si Yun Kim, Icheon-si (KR); Kang Hun Kim, Icheon-si (KR); Jun Yong Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 407 days.

(21) Appl. No.: 17/715,722

(22) Filed: Apr. 7, 2022

(65) Prior Publication Data

US 2023/0154835 A1    May 18, 2023

(30) Foreign Application Priority Data

Nov. 15, 2021 (KR) .................. 10-2021-0157050

(51) Int. Cl.
*H01L 23/00* (2006.01)
*H01L 23/498* (2006.01)
(52) U.S. Cl.
CPC .. *H01L 23/49816* (2013.01); *H01L 23/49838* (2013.01); *H01L 24/48* (2013.01); *H01L 2224/48229* (2013.01)

(58) Field of Classification Search
CPC ......... H01L 23/49816; H01L 23/49838; H01L 24/48; H01L 2224/48229; H01L 23/49811; H01L 24/08; H01L 23/3128; H01L 24/16; H01L 2224/08059; H01L 2224/16013
See application file for complete search history.

(56) References Cited

U.S. PATENT DOCUMENTS

2017/0373228 A1* 12/2017 Chang ................. H01L 33/44

FOREIGN PATENT DOCUMENTS

KR    1020000015586 A    3/2000
KR    1020170101728 A    9/2017

* cited by examiner

*Primary Examiner* — Elias Ullah
(74) *Attorney, Agent, or Firm* — William Park & Associates Ltd.

(57) ABSTRACT

A semiconductor package includes a package substrate, a connection pad including a recessed portion disposed on one surface of the package substrate, and an insulating pattern disposed on the one surface of the package substrate to be spaced apart from the connection pad. The connection pad includes an outer sidewall, an inner sidewall in the recessed portion inclining in an inward direction from an upper portion, and a groove pattern formed on the inner sidewall.

19 Claims, 12 Drawing Sheets

SEMICONDUCTOR PACKAGE INCLUDING CONNECTION PAD INCLUDING GROOVE PATTERN

CROSS-REFERENCE TO RELATED APPLICATIONS

The present application claims priority under 35 U.S.C 119 (a) to Korean Application No. 10-2021-0157050, filed on Nov. 15, 2021, which is incorporated herein by reference in its entirety.

BACKGROUND

1. Technical Field

The present disclosure generally relates to a semiconductor package including a connection pad including a groove pattern.

2. Related Art

A semiconductor package manufacturing process may include a process of separating a wafer on a semiconductor an integration process has been completed into a chip unit, a process of mounting the separated chip on a package substrate and electrically connecting the chip to the package substrate, a process of molding the chip on the package substrate, and a process of forming a solder connection structure on a connection pad disposed on a surface of the package substrate.

The solder connection structure may perform a function of electrically connecting the package substrate to an external system. The process of forming the solder connection structure may include mounting a separately prepared solder ball on the connection pad, reflowing the solder ball with heat, and attaching the reflowed solder ball to the connection pad.

SUMMARY

A semiconductor package according to an embodiment of the present disclosure includes a package substrate, a connection pad including a recessed portion disposed on one surface of the package substrate, and an insulating pattern disposed on the one surface of the package substrate to be spaced apart from the connection pad. The connection pad includes an outer sidewall, an inner sidewall in the recessed portion inclining in an inward direction from an upper portion, and a groove pattern formed on the inner sidewall.

A semiconductor package according to another embodiment of the present disclosure includes a package substrate, a connection pad including a recessed portion disposed to protrude from one surface of the package substrate, and a solder connection structure disposed on the connection pad. The connection pad includes an outer sidewall, an inner sidewall in the recessed portion inclining in an inward direction from an upper portion, an inner bottom surface connected to the inner sidewall, and a groove pattern forming a spiral path along a circumference of the inner sidewall in a plan view.

DETAILED DESCRIPTION

Figure 1:
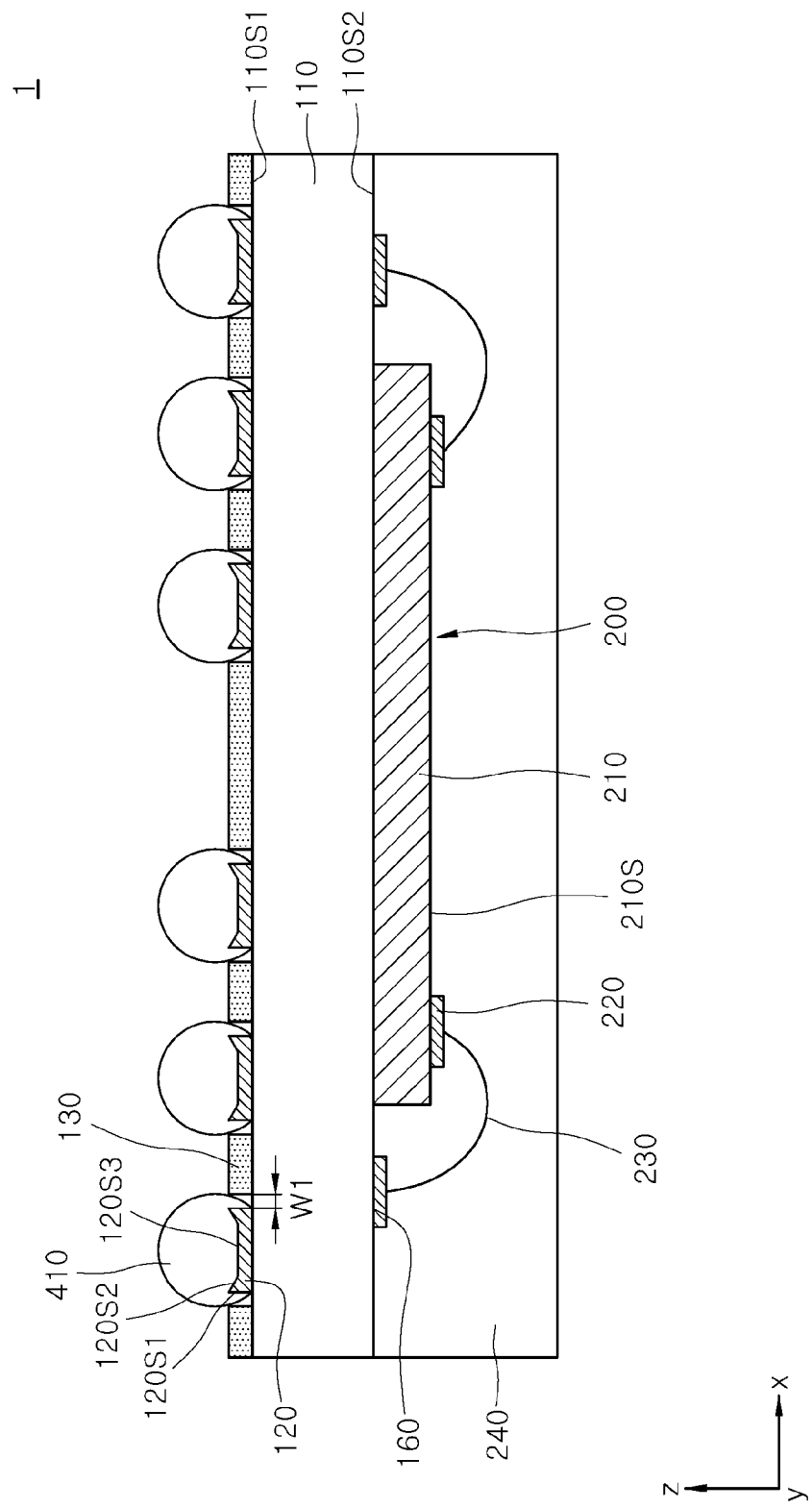
FIG. 1 is a cross-sectional view schematically illustrating a semiconductor package according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

The semiconductor package may include electronic devices such as a semiconductor chip, and the semiconductor chip may include a semiconductor substrate on which an electronic circuit is integrated, which is cut and processed in the form of a chip. A semiconductor chip may mean a memory chip in which a memory integrated circuit, such as DRAM, SRAM, NAND FLASH, NOR FLASH, MRAM, ReRAM, FeRAM, or PcRAM is integrated, or a logic chip in which a logic circuit is integrated on a semiconductor substrate, or an ASIC chip. Meanwhile, the semiconductor chip may be referred to as a semiconductor die.

The semiconductor package may include a printed circuit board (PCB) on which the semiconductor chip is mounted. The printed circuit board (PCB) may include at least one layer or more of an integrated circuit pattern, and may be referred to as a package substrate in the present specification. For communication between the package substrate and the semiconductor chip, a connection method, such as wire bonding, may be applied.

The semiconductor package may be applied to various electronic information processing devices, for example, information communication devices, such as portable terminals, bio or health care related electronic devices, and human wearable electronic devices.

Same reference numerals refer to same devices throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

Figure 2:
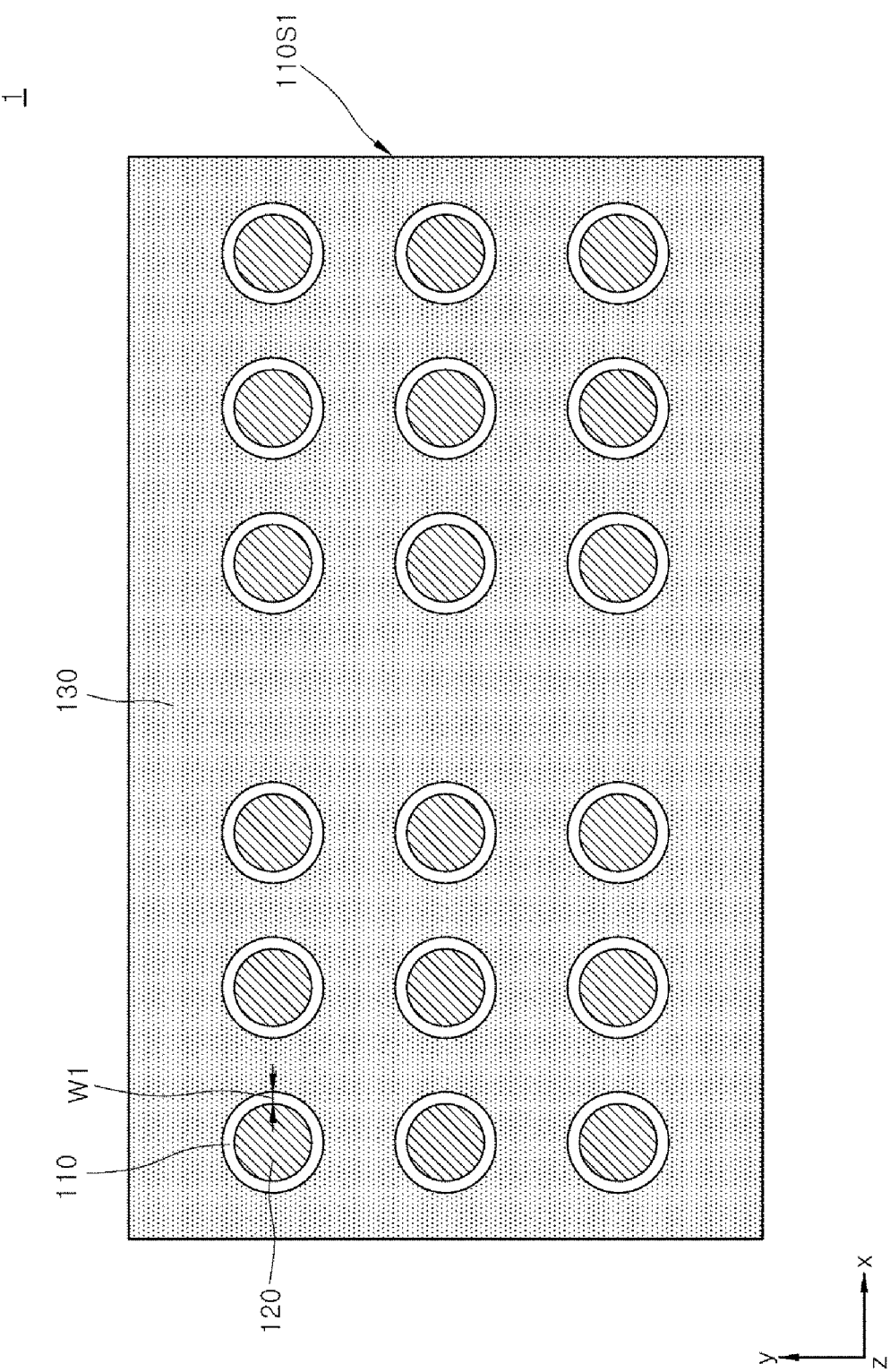
FIG. 2 is a plan view schematically illustrating a semiconductor package according to an embodiment of the present disclosure.

FIG. 1 is a cross-sectional view schematically illustrating a semiconductor package according to an embodiment of the present disclosure. FIG. 2 is a plan view schematically illustrating the semiconductor package according to the embodiment of the present disclosure. FIG. 2 schematically illustrates connection pads and an insulating pattern that are disposed on a surface of a package substrate in the semiconductor package of FIG. 1. For convenience of description, the illustration of the solder connection structure of FIG. 1 is omitted in FIG. 2.

Referring to FIG. 1, the semiconductor package 1 may include a package substrate 110 on which a semiconductor chip 200 is mounted. The package substrate 110 may have a first surface 110S1 and a second surface 110S2 that is on the opposite side of the first surface 110S1. Connection pads 120 and an insulating pattern 130 may be disposed on the first surface 110S1 of the package substrate 110. The semiconductor chip 200 may be mounted on the second surface 110S2 of the package substrate 110. As chip connection pads 160 of the package substrate 110 and chip pads 220 of the semiconductor chip 200 are connected to each other through bonding wires 230, the package substrate 110 and the semiconductor chip 200 may be electrically connected to each other.

Although not illustrated, the package substrate 110 may include at least one layer of integrated circuit pattern. The at least one layer of integrated circuit pattern may electrically connect the connection pads 120 on the first surface 110S1 of the package substrate 110 and the chip connection pads 160 on the second surface 110S2 to each other.

Referring to FIGS. 1 and 2, the connection pads 120 and the insulating pattern 130 may be disposed to be spaced apart from each other on the first surface 110S1 of the package substrate 110. The connection pads 120 and the insulating pattern 130 may be disposed to be spaced apart from each other by a first width W1.

The connection pads 120 may be disposed to protrude from the first surface 110S1 of the package substrate 110. Each of the connection pads 120 may be a pillar-shaped structure. Referring to FIG. 1, each of the connection pads 120 may include an outer sidewall 120S1, an inner sidewall 120S2, and an inner upper surface 120S3 that is connected to the inner sidewall 120S2. The connection pad 120 may include a groove pattern that is formed along the circumference of the inner sidewall 120S2, the circumference being based on the connection pad 120 having a substantially circular shape in the plan view, as described later with reference to FIGS. 3 to 5.

Each of the connection pads 120 may include a conductive material, such as copper (Cu). Solder connection structures 410 may be disposed on the connection pads 120. In an embodiment, each of the solder connection structures 410 may be disposed to cover the outer sidewall 120S1, the inner sidewall 120S2, and the inner upper surface 120S3 of each of the connection pads 120.

The solder connection structures 410 may function of electrically connecting the connection pads 120 to an external device. The external device may include, for example, hardware including an electric circuit. The external device may include, for example, a package module, a package card, and the like.

As illustrated in FIG. 2, the connection pads 120 may be aligned along the x-direction and the y-direction on the first surface 110S1 of the package substrate 110. Although not illustrated, the connection pads 120 may be electrically connected to at least one layer of integrated circuit pattern of the package substrate 110.

Referring to FIGS. 1 and 2, the insulating pattern 130 may be disposed to protrude from the first surface 110S1 of the package substrate 110. The insulating pattern 130 may be disposed to surround the connection pads 120 while being spaced from the connection pads 120. The insulating pattern 130 may include, for example, solder resist, or polymer.

Referring to FIG. 1, the semiconductor chip 200 may be mounted on the second surface 110S2 of the package substrate 110. The semiconductor chip 200 may include a chip body 210 and chip pads 220 that is disposed on a surface 210S of the chip body 210. The chip pads 220 may be disposed in edge regions on the surface 210S of the chip body 210. The chip pads 220 may be electrically connected to the chip connection pads 160 that are disposed on the second surface 110S2 of the package substrate 110 through the bonding wires 230.

Meanwhile, in the embodiment of FIG. 1, the package substrate 110 and the semiconductor chip 200 may be electrically connected to each other by a wire bonding method, but the present disclosure might not be limited thereto. In some embodiments not illustrated, the semiconductor chip 200 may be electrically connected to the package substrate 110 through flip-chip bonding using conductive bumps.

Referring to FIG. 1, a mold layer 240 burying the semiconductor chip 200, the chip connection pads 160, the chip pads 220, and the bonding wires 230 may be disposed over the second surface 110S2 of the package substrate 110. The mold layer 240 may include an electrically insulating material. The mold layer 240 may serve to protect the semiconductor chip 200 from an external environment.

Figure 3:
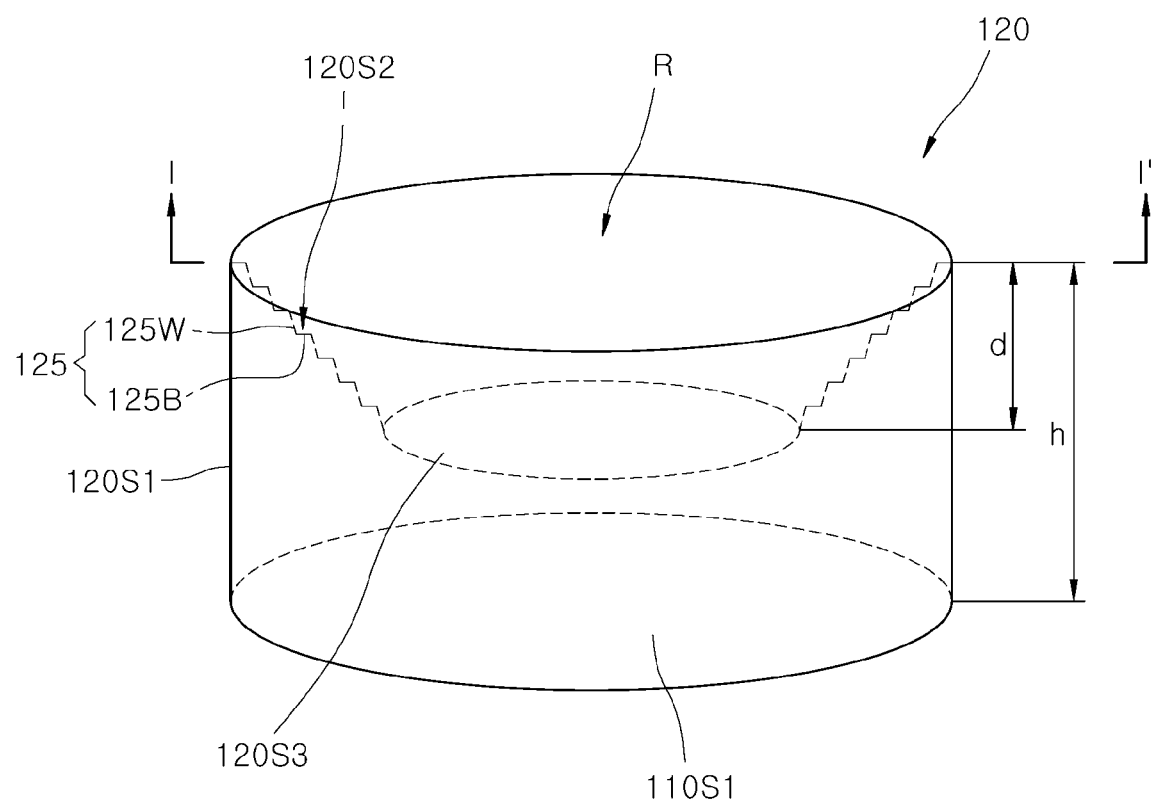
FIG. 3 is a perspective view schematically illustrating a connection pad of a semiconductor package according to an embodiment of the present disclosure.
Figure 4:
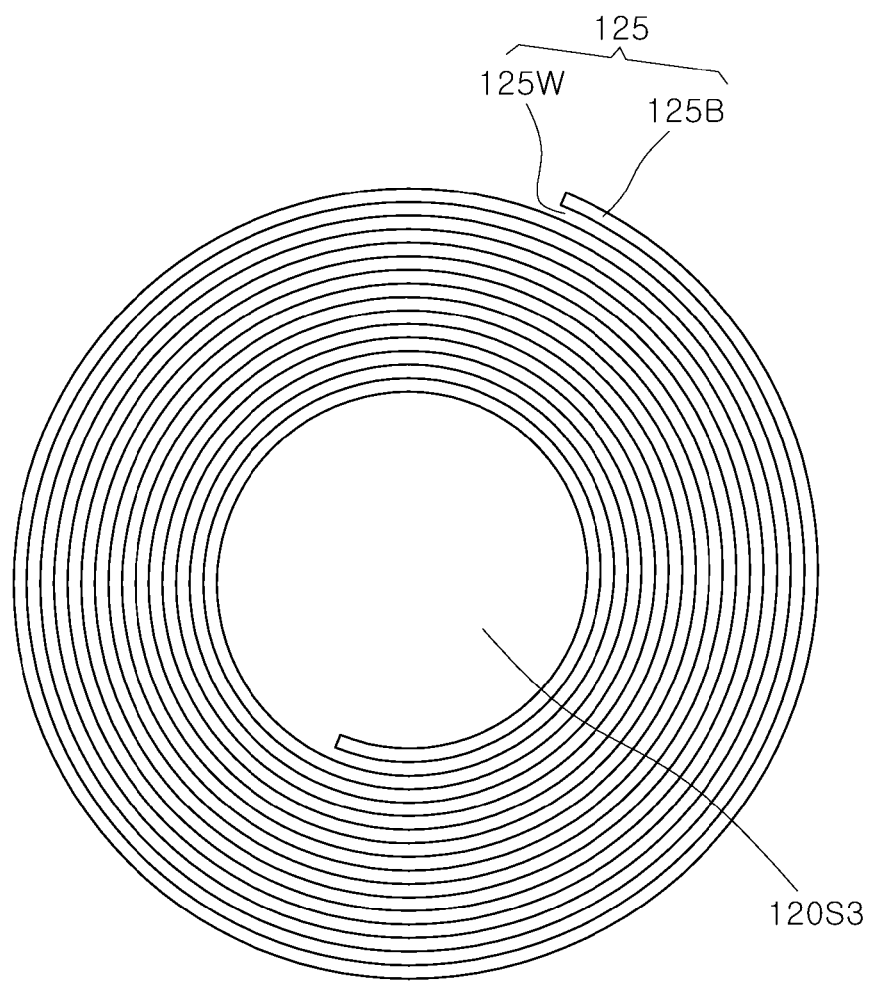
FIG. 4 is a plan view schematically illustrating a groove pattern of the connection pad of FIG. 3.
Figure 5:
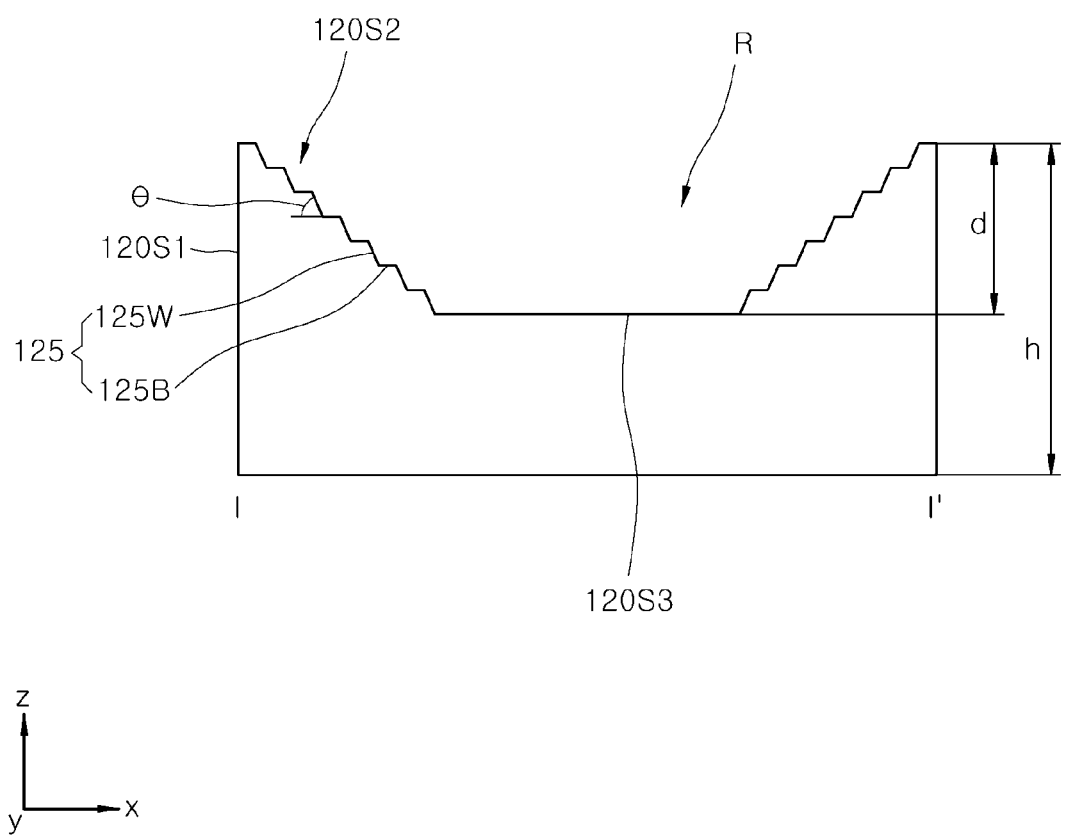
FIG. 5 a cross-sectional view of the connection pad of FIG. 3 taken along line I-I'.

FIG. 3 is a perspective view schematically illustrating a connection pad of a semiconductor package according to an embodiment of the present disclosure. FIG. 4 is a plan view schematically illustrating a groove pattern of the connection pad of FIG. 3. FIG. 5 is a cross-sectional view of the connection pad of FIG. 3 taken along line I-I'.

Referring to FIGS. 3 to 5, the connection pad 120 may be a pillar structure including a recessed portion R. In an embodiment, a depth d of the recessed portion R may be greater than 0 and less than or equal to ½ of a height h of the connection pad 120. FIGS. 3 and 5 illustrate an example in which the depth d of the recessed portion R is ½ of the height h of the connection pad 120.

The connection pad 120 may include an outer sidewall 120S1 that corresponds to a circumferential surface of the pillar structure. In addition, the connection pad 120 may include an inner sidewall 120S2 in the recessed portion R. For example, the connection pad 120 may include an inner sidewall 120S2 that is disposed to be inclined or declined inwardly from an upper portion of the pillar structure, and an inner upper surface 120S3 of the pillar structure connected to the inner sidewall 120S2. The inner upper surface 120S3 of the pillar structure may be a surface that is parallel to the first surface 110S1 of the package substrate 110 of FIG. 1. The inner sidewall 120S2 and the inner upper surface 120S3 may be located inside the recessed portion R.

In addition, the connection pad 120 may include a groove pattern 125 that is formed along the circumference of the inner sidewall 120S2. The groove pattern 125 may be a step pattern having a step difference in a direction (i.e., z-direction) that is perpendicular to the first surface 110S1 of the package substrate 110 of FIG. 1. Referring to FIG. 5, the groove pattern 125 may include a bottom surface 125B that is parallel to the first surface 110S1 of the package substrate 110, and an inclined surface 125W having a predetermined inclination angle θ compared to the bottom surface 125B. For example, the inclination angle θ may be greater than 0 degree and less than or equal to 90 degrees.

Referring to FIG. 4, the groove pattern 125 may be a vortex pattern that is formed on the inner sidewall 120S2 in a plan view. The groove pattern 125 may be disposed to form a spiral path along the inner sidewall 120S2 in a plan view. The spiral path may be formed from the top of the inner sidewall 120S2 to the bottom of the inner sidewall 120S2 and may reach the inner upper surface 120S3 of the connection pad 120. The groove pattern 125 may be disposed to surround the inner upper surface 120S3.

FIGS. 6 to 10 are views schematically illustrating a method of forming a solder connection structure using a connection pad according to an embodiment of the present disclosure. The method of forming the solder connection structure described in connection with FIGS. 6 to 10 may be described using the package substrate 110 including the connection pad 120 described with reference to FIGS. 3 to 5.

Figure 6:
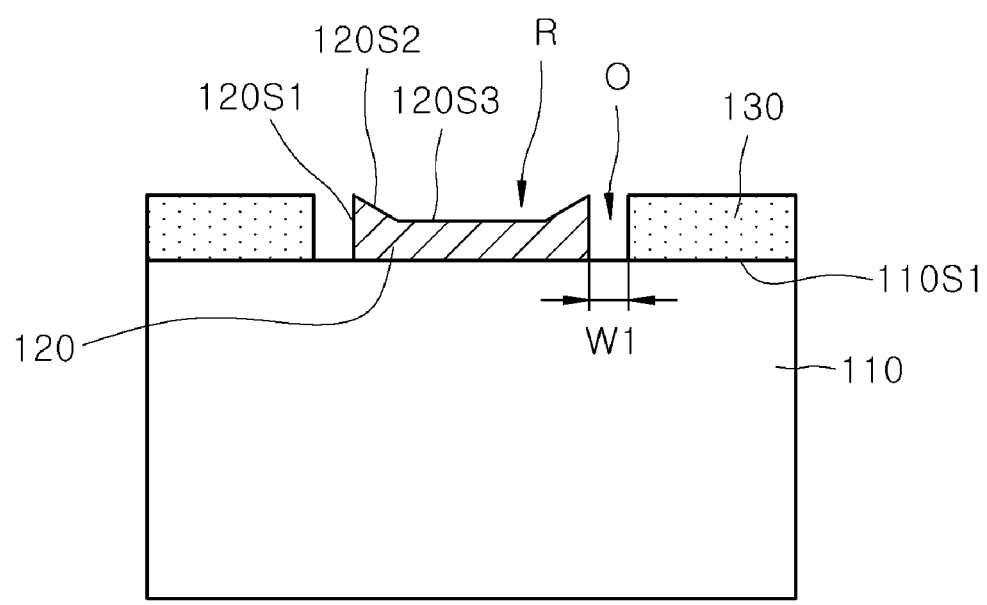
FIGS. 6 to 10 are views schematically illustrating a method of forming a solder connection structure using a connection pad according to an embodiment of the present disclosure.

Referring to FIG. 6, a connection pad 120 and an insulating pattern 130 may be disposed to be spaced apart from each other on a first surface 110S1 of the package substrate 110. The connection pad 120 and the insulating pattern 130 may be disposed to protrude from the first surface 110S1.

The connection pad 120 may include a recessed portion R. The connection pad 120 may include an outer sidewall 120S1, an inner sidewall 120S2, and an inner upper surface 120S3 that is connected to the inner sidewall 120S2. The insulating pattern 130 may be disposed to surround the connection pad 120 while being spaced apart from the connection pad 120 by a predetermined distance W1. Accordingly, an empty space O may be formed between the connection pad 120 and the insulating pattern 130 on the first surface 110S.

Figure 7:
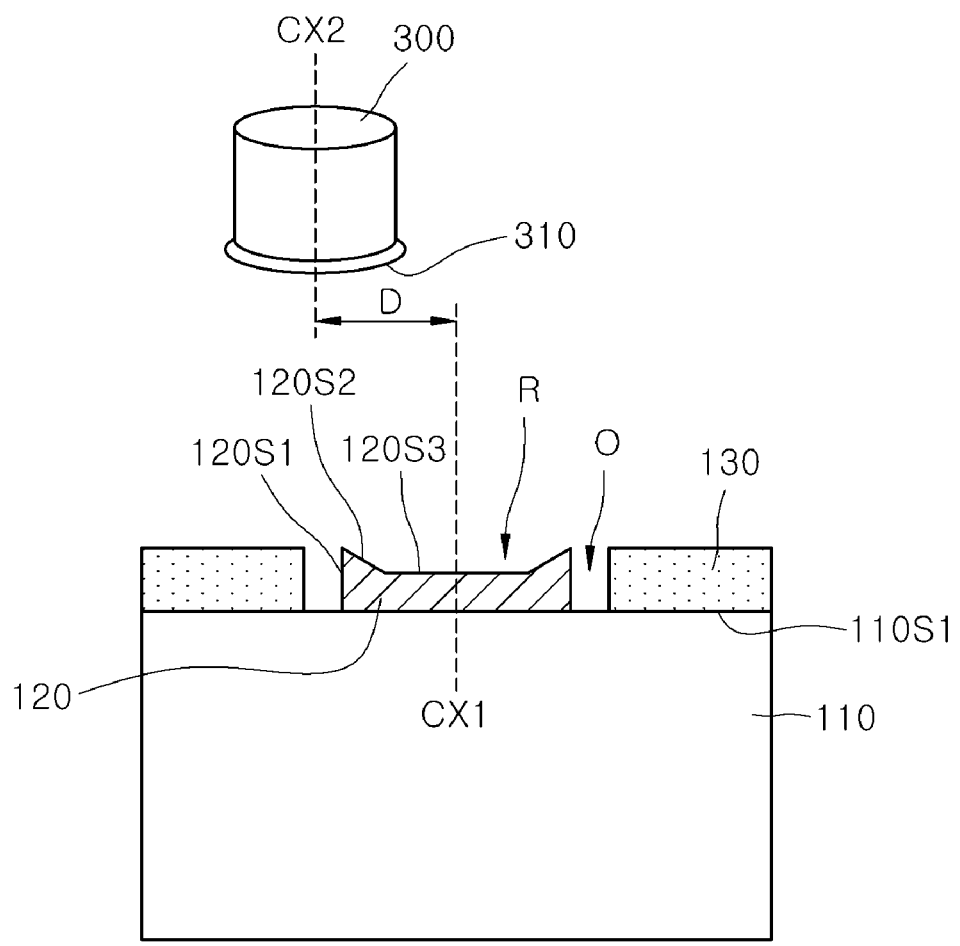

Referring to FIG. 7, a flux 310 may be provided to the connection pad 120 to remove oxide film that is formed on the connection pad 120. The flux 130 may be a viscous material and may be transferred over the connection pad 120 by a flux supply device 300 and provided to the connection pad 120. The flux 310 may be provided in a sufficient amount to sufficiently cover the exposed surface of the connection pad 120 on the first surface 110S1.

Meanwhile, in some cases, when an error in equipment or process related to the supply of the flux 310 occurs, the flux 310 may be provided at a location that deviates from the designated location on the connection pad 120. FIG. 7 illustrates an example in which a position error occurs between a reference position of the connection pad 120 and a reference position of the flux supply device 300. FIG. 7 illustrates a case in which a first axis CX1 that is perpendicular to the reference position of the connection pad 120 and a second axis CX2 that is perpendicular to the reference position of the flux supply device 300 do not coincide with each other and an error that corresponds to the distance D occurs.

According to an embodiment of the present disclosure, even if the flux 310 is provided at a position that deviates from the designated position on the connection pad 120, if the flux 310 can cover at least the inner sidewall 120S2 of the connection pad 120 at the deviated position, the flux 310 may flow so as to cover both the inner sidewall 120S2 and the inner upper surface 120S3 of the connection pad 120.

In a specific example, the flux 310 that is provided to the inner sidewall 120S2 of the connection pad 120 may move to a lower portion of the inner sidewall 120S while traveling around the inner sidewall 120S2 along the spiral path of the groove pattern 125. The spiral path may be formed so that the flux 310 having fluidity can move to the lower portion of the inner sidewall 120S along the groove pattern 125 based on at least gravity. The flux 310 may flow along the groove pattern 125 to reach the inner upper surface 120S3 of the connection pad 120. That is, the spiral path of the groove pattern 125 that is formed on the inclined inner sidewall 120S2 may provide a path through which the flux 310 may flow to the inner upper surface 120S3 of the connection pad 120.

Referring to FIG. 7, because the insulating pattern 130 is disposed to surround the connection pad 120, the empty space O may be a closed space. Accordingly, when the flux 310 is provided to the empty space O, the flux 310 may flow into the closed space, thereby sufficiently filling the empty space O. As a result, the flux 310 may cover the entire outer sidewall 120S1 of the connection pad 120.

Figure 8:
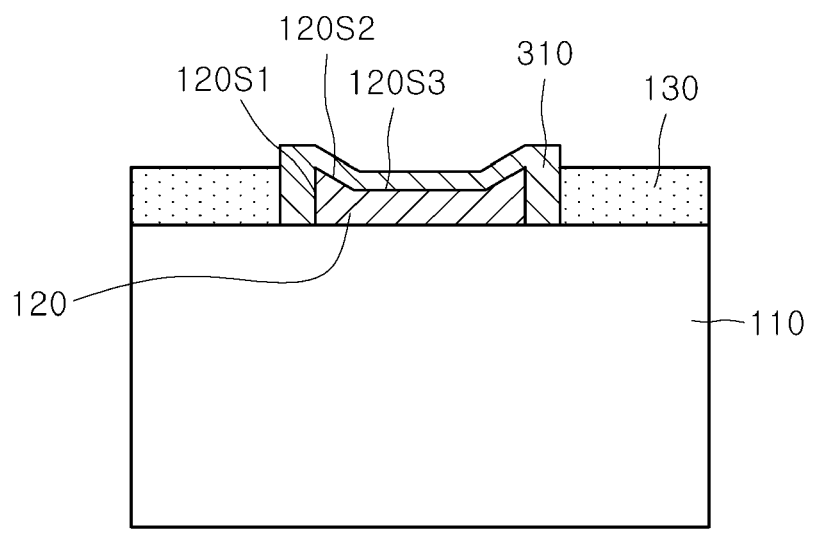
Figure 9:
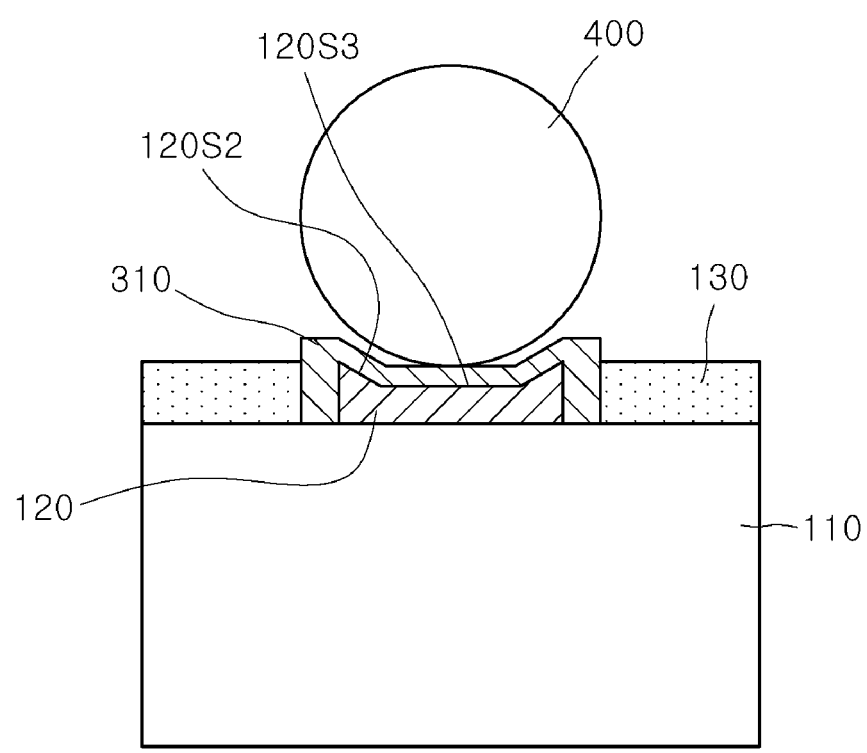

FIG. 8 illustrates a state in which the flux 310 covers the outer sidewall 120S1, the inner sidewall 120S2, and the inner upper surface 120S3 of the connection pad 120 through the operations described with reference to FIGS. 6 and 7. Referring to FIG. 9, a separate solder ball 400 may be mounted on the connection pad 120 to which the flux 310 has been coated.

Figure 10:
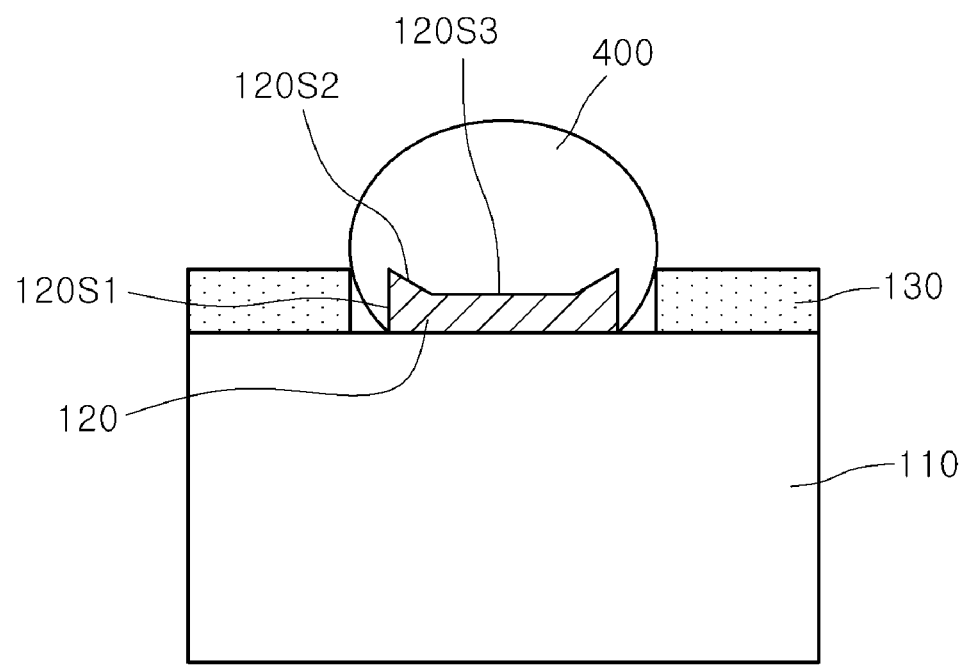

Referring to FIG. 10, heat may be applied to reflow the solder ball 400. In this case, the applied heat may allow the flux 310 to chemically react with the connection pad 120 to remove the oxide that is formed on the connection pad 120. In addition, the applied heat may evaporate and remove the flux 310.

The reflowed solder ball 400 may cover a surface of the connection pad 120 from which the oxide has been removed to form a solder connection structure 410. The solder connection structure 410 may contact the outer sidewall 120S1, the inner sidewall 120S2, and the inner upper surface 120S3 of the connection pad 120. Because the solder connection structure 410 contacts all of the outer sidewall 120S1, the inner sidewall 120S2, and the inner upper surface 120S3 of the connection pad 120, the electrical contact resistance between the solder connection structure 410 and the connection pad 120 may be sufficiently reduced.

Figure 11:
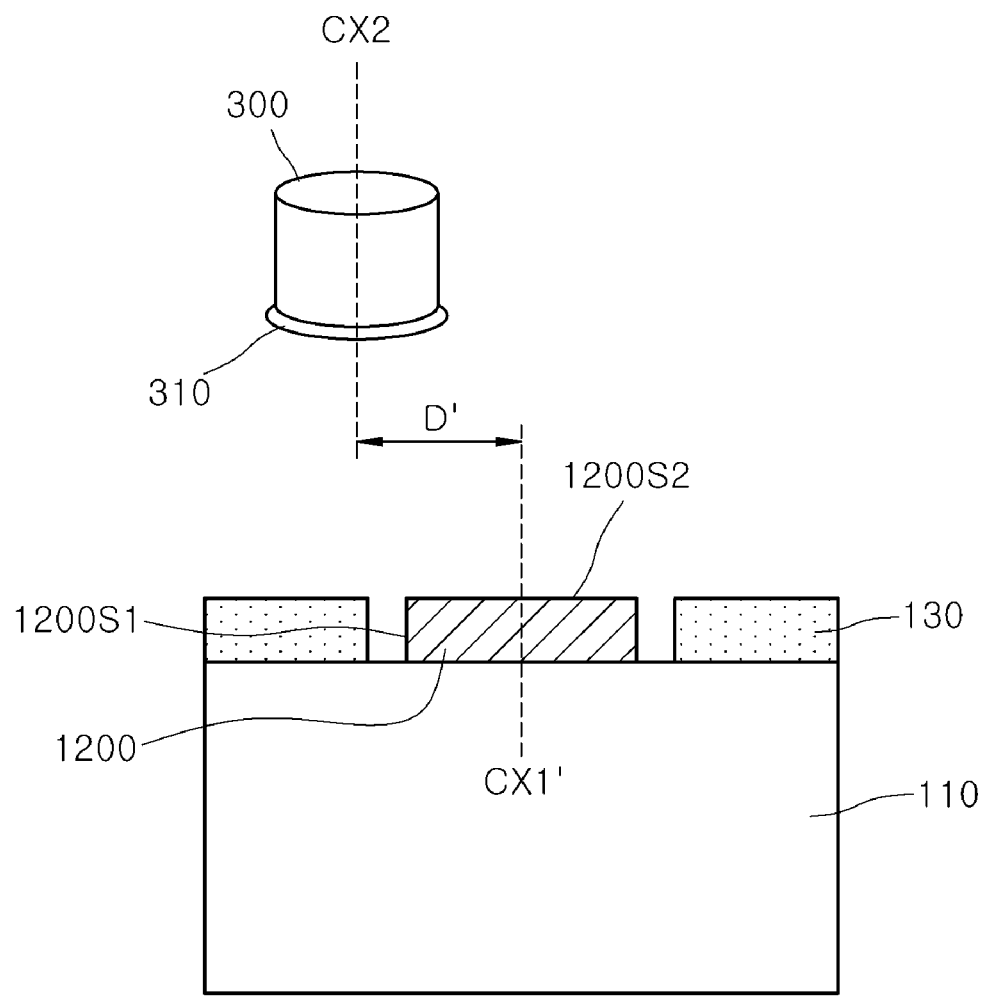
FIGS. 11 and 12 are views schematically illustrating a method of forming a solder connection structure using a connection pad according to a comparative example of the present disclosure.
Figure 12:
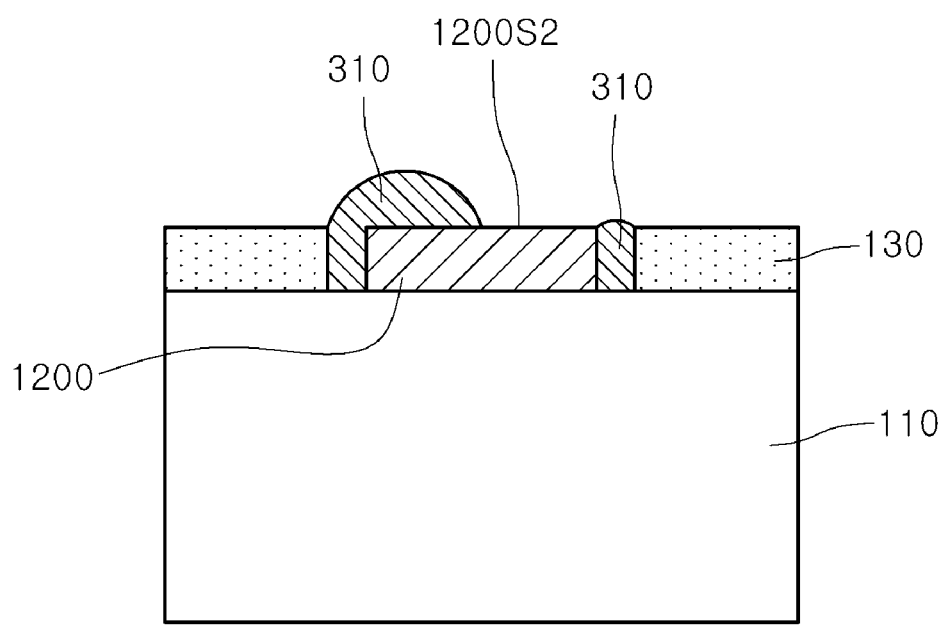

FIGS. 11 and 12 are views schematically illustrating a method of forming a solder connection structure using a connection pad according to a comparative example of the present disclosure. The connection pad according to the comparative example may have a different shape from the connection pad according to the embodiment of the present disclosure.

Referring to FIG. 11, the connection pad 1200 may be a columnar pillar structure. The connection pad 1200 may include an outer sidewall 1200S1 that is an outer circumferential surface of the pillar structure, and an upper surface 1200S2 that is connected to the outer sidewall 1200S1. The connection pad 1200 does not include a recessed portion R when compared to the connection pad (120 of FIG. 6) according to an embodiment of the present application. In addition, the connection pad 1200 does not have an inner sidewall and a groove pattern that is formed on the inner sidewall. An insulating pattern 130 is disposed to be spaced apart from the connection pad 1200 by a predetermined distance. The insulating pattern 130 is disposed to surround the connection pad 1200.

Referring to FIG. 11, as described with reference to FIG. 7, a flux 310 may be provided at a location that deviates from the designated location on the connection pad 1200 due to an equipment error or a process error. FIG. 11 illustrates a case in which a position error occurs, the position error corresponding to a distance D' between a first axis CX1' perpendicular to a reference position on the connection pad 1200 and a second axis CX2 that is perpendicular to a reference position of a flux supply device 300.

According to the comparative example of the present disclosure, as illustrated in FIG. 11, when the flux 310 is provided at a position that deviates from the designated position on the connection pad 1200, it may be difficult for the flux 310 to completely cover the upper surface 1200S2 of the connection pad 1200.

Referring to FIG. 12, the flux 310 that is provided on a portion of the upper surface 1200S2 of the connection pad 1200 might not flow on the entire flat upper surface 1200S2. The connection pad 1200 does not have the inclined inner sidewall and the spiral path of the groove pattern 125 that is formed on the inner sidewall of the connection pad 120 according to an embodiment of the present application. Therefore, a driving force for the flux 310 to flow from a portion of the flat upper surface 1200S2 to the entirety may be insufficient.

Accordingly, the oxide might not be sufficiently removed from a portion of the upper surface 1200S2 that does not contact the flux 310. As a result, after the reflow process of the solder ball is completed, the adhesive force may be reduced in the contact surface of the solder connection structure and the region of the connection pad 1200 in which the oxide is insufficiently formed, resulting in poor contact. The poor contact may cause deterioration of electrical reliability between the connection pad 1200 and the solder connection structure.

As described above, according to an embodiment of the present disclosure, the semiconductor package may include a package substrate, a connection pad disposed on a surface of the package substrate, and an insulating pattern disposed on the surface to be spaced apart from the connection pad in a lateral direction. The connection pad may include an outer sidewall, an inner sidewall disposed to be inclined or declined in an inward direction from an upper portion, and a groove pattern that is formed along a circumference of the inner sidewall.

According to an embodiment of the present disclosure, when a process of removing the oxide that is formed on the connection pad by providing a flux to the surface of the connection pad is performed, even if the flux is provided to deviate from a designated position on the upper surface of the connection pad, the flux flows along the groove pattern that is formed on the inner sidewall of the connection pad, so that the flux completely covers the upper surface. Accordingly, after a subsequent solder connection structure forming process, bonding reliability between the connection pad and the solder connection structure may be improved.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
a package substrate;
a connection pad including a recessed portion disposed on one surface of the package substrate; and
an insulating pattern disposed on the one surface of the package substrate,
wherein the connection pad comprises:
an outer sidewall;
an inner sidewall in the recessed portion, the inner sidewall inclining in an inward direction from an upper portion; and
a groove pattern formed on the inner sidewall,
wherein the connection pad and the insulating pattern are spaced apart from each other by a distance in a lateral direction to form an empty space on the one surface of the package substrate.

2. The semiconductor package of claim 1, further comprising a semiconductor chip mounted on the other surface opposite to the one surface of the package substrate.

3. The semiconductor package of claim 1, wherein the connection pad is disposed to protrude from the one surface of the package substrate.

4. The semiconductor package of claim 1, wherein the connection pad is a pillar structure having the recessed portion.

5. The semiconductor package of claim 4, wherein a depth of the recessed portion of the connection pad is greater than zero (0) and less than or equal to half (½) the height of the connection pad.

6. The semiconductor package of claim 1, wherein the groove pattern is a step pattern having a step difference in a direction perpendicular to the one surface of the package substrate.

7. The semiconductor package of claim 1, wherein, in a plan view, the groove pattern is formed along a circumference of the inner sidewall to form a vortex pattern on the inner sidewall.

8. The semiconductor package of claim 1, wherein, in a plan view, the groove pattern is formed along a circumference of the inner sidewall to form a spiral path along the inner sidewall.

9. The semiconductor package of claim 8, wherein the spiral path is formed from a top of the inner sidewall to a bottom of the inner sidewall.

10. The semiconductor package of claim 1, wherein the connection pad further comprises an inner upper surface connected to the inner sidewall.

11. The semiconductor package of claim 10, wherein, in a plan view, the groove pattern is disposed on the inner sidewall to surround the inner upper surface.

12. The semiconductor package of claim 1, wherein, in a plan view, the insulating pattern is disposed to surround the connection pad while being spaced apart from the connection pad.

13. The semiconductor package of claim 1, further comprising a solder connection structure disposed on the connection pad.

14. A semiconductor package comprising:
a package substrate;
a connection pad including a recessed portion disposed to protrude from one surface of the package substrate;
an insulating pattern disposed on the one surface of the package substrate; and
a solder connection structure disposed on the connection pad, wherein the connection pad comprises:
an outer sidewall;
an inner sidewall in the recessed portion, the inner sidewall inclining in an inward direction from an upper portion;
an inner upper surface connected to the inner sidewall; and
a groove pattern forming a spiral path along a circumference of the inner sidewall in a plan view,
wherein the connection pad and the insulating pattern are spaced apart from each other by a distance in a lateral direction to form an empty space on the one surface of the package substrate.

15. The semiconductor package of claim 14, wherein the connection pad is a pillar structure having a recessed portion.

16. The semiconductor package of claim 14, wherein the groove pattern is a step pattern having a step difference in a direction perpendicular to the one surface of the package substrate.

17. The semiconductor package of claim 14, wherein, in a plan view, the groove pattern is a vortex pattern formed on the inner sidewall.

18. The semiconductor package of claim 14, wherein the spiral path is formed from a top of the inner sidewall to a bottom of the inner sidewall.

19. The semiconductor package of claim 14, wherein, in a plan view, the groove pattern is disposed on the inner sidewall to surround the inner upper surface.

\* \* \* \* \*